United States Patent [19]

Yonezawa et al.

[11] 3,907,574

[45] Sept. 23, 1975

[54] PHOTOPOLYMERIZABLE COMPOSITION

[75] Inventors: Teruhiko Yonezawa; Nobuyuki Kita, both of Odawara, Japan

[73] Assignee: Fuji Photo Film Co., Ltd., Minami-ashigara, Japan

[22] Filed: Feb. 7, 1974

[21] Appl. No.: 440,609

[30] Foreign Application Priority Data

Feb. 7, 1973 Japan ............................... 48-14805

[52] U.S. Cl. .................... 96/115 P; 96/33; 96/35.1; 96/36.3; 96/115 R; 204/159.15

[51] Int. Cl.² ............................................ G03C 1/70

[58] Field of Search ........................ 96/115 P, 115 R; 204/159.15

[56] References Cited

UNITED STATES PATENTS

| | | | |
|---|---|---|---|
| 3,677,920 | 7/1972 | Kai et al. | 204/159.15 |
| 3,740,224 | 6/1973 | Barzynski et al. | 96/33 |
| 3,782,961 | 1/1974 | Takahashi et al. | 96/115 R |

*Primary Examiner*—Ronald H. Smith

*Attorney, Agent, or Firm*—Sughrue, Rothwell, Mion, Zinn & Macpeak

[57] ABSTRACT

A photopolymerizable composition which comprises (a) 80 to 50% by weight of a divinylurethane compound represented by the following general formula, $$\left[CH_2{=}\overset{R_1}{\overset{|}{C}}{-}\overset{O}{\overset{\|}{C}}OCH_2\overset{R_2}{\overset{|}{C}}HO{-}(\overset{O}{\overset{\|}{C}}{-}A{-}\overset{O}{\overset{\|}{C}}OCH_2\overset{R_3}{\overset{|}{C}}HO)_n{-}\overset{O}{\overset{\|}{C}}NH\right]_2{-}B$$

in which $R_1$, $R_2$ and $R_3$ each represents a hydrogen atom or a methyl group, $n$ represents 1, 2 or 3, A represents a divalent residue of a cyclic carboxylic acid anhydride having 4 to 10 carbon atoms, B represents $-R_4-$ or $-R_4NHCOOR_5OOCNHR_4-$, in which $R_4$ represents an alkylene group with 4 to 13 carbon atoms, cycloalkylene group or arylene group and $R_5$ represents an alkylene chain with 2 to 8 carbon atoms or an oxyalkylene chain with 2 to 4 carbon atoms, (b) 20 to 50% by weight of an organic high molecular weight polymer miscibile with the divinylurethane compound and having carboxyl groups on the side chains and an acid number of 30 or more and (c) 0.01 to 10% by weight of a light sensitizer capable of initiating the photopolymerization of an ethylenically unsaturated compound upon exposure to active radiation.

9 Claims, No Drawings

PHOTOPOLYMERIZABLE COMPOSITION

BACKGROUND OF THE INVENTION

1. Field of the Invention

This invention relates to a photopolymerizable composition for a printing relief or a photoresist.

2. Description of the Prior Art

It is well known that a relief image for printing or for a photoresist can be obtained by subjecting an ethylenically unsaturated compound capable of addition polymerization to the action of active irradiation in the presence of an optical sensitizer thus hardening and rendering the polymer three-dimensional and insoluble. Such a composition comprises an ethylenically unsaturated compound capable of addition polymerization and an organic linear high molecular weight polymer and is coated onto a suitable support at room temperature in the form of a solid or gel.

SUMMARY OF THE INVENTION

In accordance with the present invention, there is provided a photopolymerizable composition comprising as the ethylenically unsaturated compound a divinylurethane compound represented by the following general formula, $$\left[ CH_2{=}\overset{R_1}{\overset{|}{C}}-\overset{O}{\overset{\|}{C}}OCH_2\overset{R_2}{\overset{|}{C}}HO-(\overset{O}{\overset{\|}{C}}-A-\overset{O}{\overset{\|}{C}}OCH_2\overset{R_3}{\overset{|}{C}}HO-)_n\overset{O}{\overset{\|}{C}}NH \right]_2-B$$

in which $R_1$, $R_2$ and $R_3$ each represents a hydrogen atom and a methyl group, $n$ represents 1, 2 or 3, A represents the residue of a cyclic carboxylic acid anhydride with a total of 4 to 10 carbon atoms, B represents $-R_4-$ or $-R_4NHCOOR_5OOCNHR_4-$, in which $R_4$ represents an alkylene group with 4 to 13 carbon atoms, a cycloalkylene group or an arylene group and $R_5$ represents an alkylene chain with 2 to 8 carbon atoms or an oxyalkylene chain with 2 to 4 carbon atoms.

DETAILED DESCRIPTION OF THE INVENTION

That is to say, the present invention provides a photopolymerizable composition which is in the form of a solid or gel at room temperature (about 20° to 30°C) and which comprises the above described divinylurethane compound, an organic high molecular weight polymer containing carboxyl groups and having an acid number of 30 or more and a small amount of a light sensitizer. This is suitable for the production of a printing plate for a relief image having a relief height of 0.2 mm or more. In addition, this composition is suitable for use as a light-sensitive layer for a photoresist having a relief height of 1 to 10 microns. In these cases, an organic high molecular weight polymer having carboxyl groups with an acid number of 30 or more on the side chains is used in order to provide a composition whereby the non-exposed areas can be dissolved in an aqueous weak alkali solution or aqueous weak alkali solution containing an organic solvent soluble in water (which will later be referred to as "development"). Such an organic high molecular weight polymer is not used as a binder, in contrast to its generally employed use. Thus the organic high molecular weight polymer is used in a smaller quantity than the divinylurethane compound. The divinylurethane compound as a hardener can be used in a relatively large quantity, since it is a viscous liquid or a solid at room temperature. Using the divinylurethane compound, therefore, a sharp relief image of high resolution can be obtained without the prior art disadvantage that a hardened area is swelled and dissolved in the developer upon development for a long period of time. If the content of the divinylurethane compound exceeds 80% by weight based on the overall weight of the solid components, the development with an aqueous weak alkali becomes difficult, while, if less than 50% by weight is used, the light sensitivity is reduced markedly and a hardened image area is swelled and dissolved off upon development for a long period of time.

In the above described general formula of the divinylurethane compound, A represents the divalent moiety derrived from a cyclic carboxylic acid anhydride of 4 to 10 carbon atoms. Illustrative examples of such cyclic carboxylic acid anhydrides are phthalic anhydride, tetrahydrophthalic anhydride, hexahydrophthalic anhydride, succinic anhydride, maleic anhydride, 3,6-endomethylene-$\Delta^4$-tetrahydrophthalic anhydride, 3,6-endooxy-$\Delta^4$-tetrahydrophthalic anhydride, $\alpha$-chloromaleic anhydride, $\alpha$-phenyl maleic anhydride, and glutaric anhydride. $R_4$ represents a divalent group derrived from a diisocyanate compound, for example, a divalent group such as

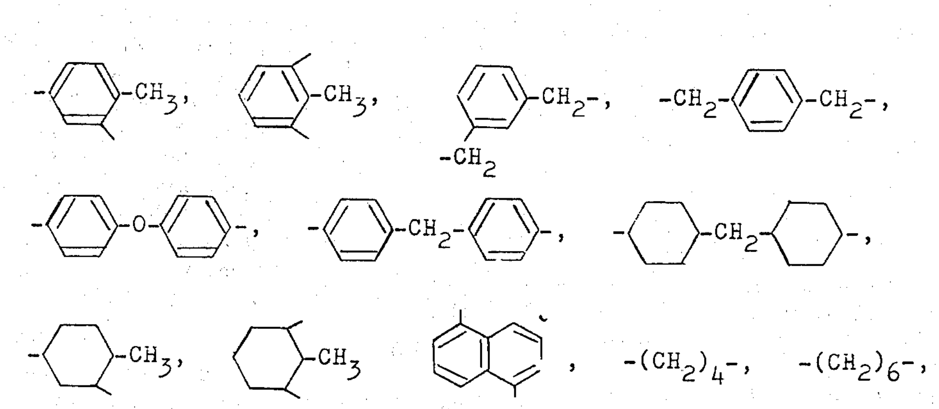

$-(CH_2)_4-\underset{COOCH_3}{\underset{|}{C}H}-$ , $-(CH_2)_2-O\overset{O}{\overset{\|}{C}}CH{=}CH\overset{O}{\overset{\|}{C}}O-(CH_2)_2-$, and

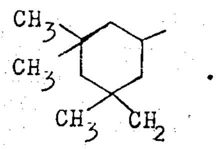

$R_5$ represents, for example, $-CH_2CH_2-$, $-(CH_2)_4-$, $-(CH_2)_6-$, $-CH_2CH_2-(OCH_2CH_2)_l-$, $$-CH_2\overset{\overset{CH_3}{|}}{C}H-(OCH_2-(\overset{\overset{CH_3}{|}}{C}H)_m-$$

or $-CH_2CH_2CH_2CH_2-(OCH_2CH_2CH_2CH_2)_n-$, in which l, *m* and *n* represent 1 to 10.

The divinylurethane compound can be prepared by reacting at a temperature of about 20° to 120°C, preferably 60° to 90°C, a monohydroxy compound represented by the following general formula, $$CH_2=\overset{\overset{R_1}{|}}{C}COOCH_2\overset{\overset{R_2}{|}}{C}HO-(\overset{\overset{O}{\|}}{C}-A-\overset{\overset{O}{\|}}{C}OCH_2\overset{\overset{R_3}{|}}{C}HO)_n-H$$

in which $R_1$, $R_2$ and $R_3$, *n* and A have the same meaning as described above, with a diisocyanate compound having two isocyanate groups in one molecule in a molar ratio of about 2:1 of the compound of the general formula to the diisocyanate, optionally in the presence of a suitable catalyst such as a tertiary amine or a metal salt. The process can be suitably conducted in the absence of a solvent or in the presence of an inert solvent and when open to the air desirably in the presence of a small amount of a polymerization inhibitor. Since the divinylurethane compound in which an aromatic ring as $R_4$ is directly connected with the adjacent urethane group, in particular, one aromatic ring being directly connected with two urethane groups, absorbs by itself the ultraviolet region corresponding to the sensitive region of a photopolymerization initiator, a light-sensitive plate employing the divinylurethane compound lacks in hardening of the lower layers of the light-sensitive layers thereof and side etching takes place. Therefore, no harm will occur in the case of using it for photoresists with a relief height of 1 to 10 microns. However, in the case of using it for the production of printing plates for relief printing with a relief height of 0.2 mm or more, it is desirable to select a divinylurethane compound in which $R_4$ is not of a resonance structure with the adjacent urethane group, e.g., in which $R_4$ is not of the structure

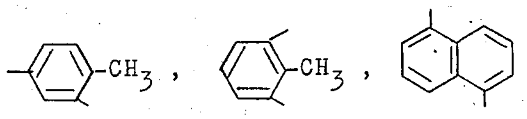

which are divalent groups derived from toluene diisocyanate and naphthalene diisocyanate, which gives a relief image excellent in light-sensitivity and free from side etching.

Suitable organic high molecular weight polymers which are miscible with the divinylurethane compound of the invention as well as carboxyl groups with an acid number 0f 30 or more, e.g., up to about 400, at the side chain and which can be used are acidic cellulose derivatives having carboxyl groups on the side chains, such as cellulose acetate phthalate, hydroxypropylmethyl cellulose phthalate and hydroxypropylmethyl cellulose acetate hexahydrophthalate, acidc polyvinyl alcohol derivatives having carboxyl groups at the side chains prepared by reacting a polyvinyl alcohol derivative with a cyclic acid anhydride, acrylic acid copolymers, methacrylic acid copolymers, itaconic acid copolymers, crotonic acid copolymers and maleic anhydride copolymers partially esterified with an alcohol, e.g., of 1 to 18 carbon atoms (such as methyl alcohol, ethyl alcohol, butyl alcohol, benzyl alcohol, lauryl alcohol). Examples of suitable copolymers are methylmethacrylate/methacrylic acid in a ratio of 90/10 wt%, methylmethacrylate/acrylonitrile/acrylic acid in a ratio of 75/15/10 wt%, styrene/itaconic acid in a ratio of 90/10 wt%, vinyl acetate/crotonic acid in a ratio of 93/7 wt%, styrene/maleic anhydride in a ratio of 50/50 mol% esterified with an alcohol as previously described. Of these materials, those having carboxyl groups with an acid number of 100 or more are preferably used for the production of a printing plate for relief printing with a relief height of 0.2 mm or more, because development can effectively be accomplished thereby. A suitable molecular weight of the organic high molecular weight material ranges from about 1000 and above and a suitable amount of the organic high molecular weight polymer material in the composition can range from about 20 to 50%, preferably 30 to 40%, by weight.

As the sensitizer of the invention, any of the known sensitizers can be used. In particular, thermally stable sensitizers are preferably used, for example, benzoin, benzoin alkyl ethers such as benzoin methyl ether and benzoin ethyl ether, anthraquinone derivatives such as 2-ethylanthraquinone and 2-t-butylanthraquinone, benzyl, bicarbonyl compounds such as 4,4'-oxydibenzyl and biacetyl, carbonyl compounds such as benzophenone, Michler's ketone, xanthone, 2-chloroxanthone, triacetylbenzene and anthrone, 9-phenylacridine and 3-methyl-2-benzoylmethylenenaphtho(1,2-$\alpha$)thiazole. One or more of these light sensitizers can be used. A suitable amount of sensitizer ranges from about 0.01 to 10, preferably 0.5 to 2, percent by weight.

As a developer for the photopolymerizable composition according to the invention, a 0.1 to 2% by weight aqueous solution of sodium hydroxide, potassium hydroxide, monoethanolamine, diethanolamine, triethanolamine or ammonia is preferably used, but 0.1 to 10% by weight of a water-soluble organic solvent such as isopropyl alcohol, n-propyl alcohol, benzyl alcohol, ethylene glycol mono ethyl ether, ethylene glycol mono butyl ether, etc., or surfactant can additionally be and preferably is added so as to increase further the developing properties thereof.

The following examples are given in order to illustrate the invention in greater detail without limiting the same. Unless otherwise indicated all parts and percentages are by weight.

EXAMPLE 1

398 g (1.0 mol) of hydroxyethylphthalyl methacrylate represented by the structure:

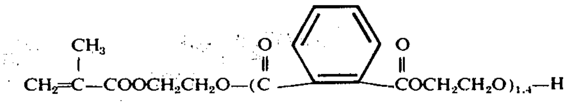

(OH number: 141; average molecular weight: 398), 94 g (0.5 mol) of xylylene diisocyanate, 1.5 g of benzoic acid as a catalyst and 0.25 g of 2,6-di-t-butylcresol as a polymerization inhibitor were mixed and reacted at 80°C for 7 hours while bubbling air through the mixture to obtain a divinylurethane compound (I) having a residual isocyanate number of 5.2.

To 60 parts of this divinylurethane compound were added 30 parts of hydroxypropylmethyl cellulose hydrogen phthalate (HP-55: trade mark, produced by Shinetsu Chemical Industry Co.; acid number: 127), 10 parts of a styrene-maleic anhydride copolymer partially esterified with a lower alcohol (Styrite CM-2L: trademark, produced by Daido Kogyo K.K.), 1 part of benzoin ethyl ether as a sensitizer, 0.05 part of 4,4'-thiobis(3-methyl-6-t-butylphenol) as a thermal polymerization inhibitor and 40 parts of acetone and 17 parts of methanol as a solvent, dissolved and allowed to stand at 40°C for 24 hours to defoam the mixture. The thus defoamed light-sensitive liquid was coated onto a polyester film of a thickness of 100 microns so as to give a film thickness of 0.6 mm on a dry basis using a knife coater and then dried at room temperature for 1 day and in hot air at 50°C for 1 day. The dried sheet was laminated at 80°C on a grained aluminum plate having a thickness of 0.3 mm. After the polyester film of 100 microns was stripped from the laminated light-sensitive plate, a photographic negative film having alphabetic designations was contacted with the light-sensitive plate and exposed for 10 minutes using a vacuum printer in which chemical fluoresent lamps of 20 W, FL-20BL (made by Toshiba Electric Co.) were placed at distance of 6 cm. After the exposure, the non-exposed area was dissolved off with weak aqueous alkali solution containing 0.5% of isopropyl alcohol and 0.2% of sodium hydroxide to obtain a sharp relief image.

EXAMPLE 2

384 g (1.0 mol) of hydroxyethylphthalyl acrylate represented by the structure:

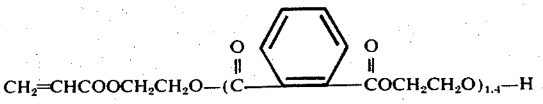

(OH number: 147; average molecular weight: 384), 94 g (0.5 mol) of xylylene diisocyanate and 0.25 g of 2,6-di-t-butylcresol as a polymerization inhibitor were mixed and reacted at 80°C for 8 hours while bubbling air through the mixture to thus obtain a divinylurethane compound (II) having a residual isocyanate number of 4.7.

To 60 parts of this divinylurethane compound were added 40 parts of the hydroxypropylmethyl cellulose phthalate of Example 1, 1 part of benzoin ethyl ether, 0.05 part of 4,4'-thiobis(3-methyl-6-t-butylphenol) and 40 parts of acetone and 25 parts of methanol, dissolved and allowed to stand at 40°C for 24 hours to defoam the mixture. The defoamed light-sensitive liquid was coated onto a polyester film in a manner similar to Example 1 to thus obtain a light-sensitive plate having a light-sensitive layer with a thickness of 0.6 mm. After the polyester film of 100 microns was stripped from the light-sensitive plate, a photographic negative film having alphabetic designations was contacted with the light-sensitive plate and exposed for 7 minutes using a vacuum printer in which chemical lamps of 20 W, FL-20 BL (made by Toshiba Electric Co.) were arranged at a distance of 6 cm. After the exposure, the development was carried out with an aqueous alkaline solution containing 0.5% of benzyl alcohol and 0.5% of sodium hydroxide to obtain a sharp relief image.

EXAMPLE 3

197 g (1.05 mols) of xylylene diisocyanate was added to 53 g (0.5 mol) of diethylene glycol and reacted at 80°C for 2 hours. Thereafter, 390 g (1.0 mol) of hydroxyethyltetrahydrophthalyl acrylate (OH number: 146; average molecular weight: 390) represented by the structure:

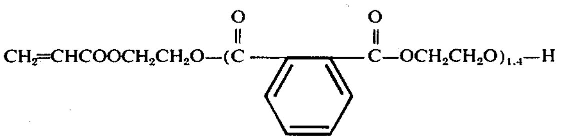

and 0.30 g of 2,6-di-t-butylcresol were added thereto and reacted at 80°C for 8 hours while bubbling air through the mixture to thus obtain a divinylurethane compound (III) having a residual isocyanate number of 4.8.

To 60 parts of this divinylurethane compound (III) were added 40 parts of cellulose acetate hydrogen phthalate having a phthalic acid content of 32% by weight (CAP: trade name produced by Wako Junyaku K.K.), 1 part of benzoin ethyl ether as a sensitizer, 0.05 part of 4,4'-thiobis(3-methyl-6-t-butylphenol) as a thermal polymerization inhibitor, 0.025 part of methylene blue as an image coloring agent and 40 parts of acetone and 30 parts of methanol as a solvent, dissolved and allowed to stand at 40°C for 24 hours to defoam the mixture. The defoamed solution was coated onto a grained aluminum plate having a thickness of 0.3 mm so as to provide a film thickness of the light-sensitive layer of 0.6 mm in a manner similar to Example 1. This light-sensitive plate was exposed for 7 minutes using a similar exposing apparatus to that of Example 1 and then developed with an aqueous solution of 0.5% triethanolamine, thus obtaining a sharp relief image with a hardened area which was quite flexible.

EXAMPLE 4

384 g (1.0 mol) of hydroxyethylphthalyl acrylate (OH number: 147; average molecular weight: 384) represented by the structure:

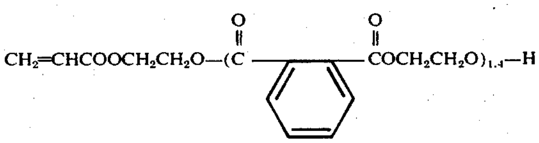

87 g (0.5 mol) of toluene diisocyanate and 0.25 g of 2,6-di-t-butylcresol as a polymerization inhibitor were mixed and reacted at 80°C for 2 hours while bubbling air through the mixture to which 1.5 g of triethylamine as a catalyst was then added, and the mixture was reacted for 6 hours to thus obtain a divinylurethane compound (IV) having a residual isocyanate number of 3.6.

To 7 g of this divinylurethane compound (IV) were added 3 g of poly(methyl methacrylate/methacrylic acid = 9/1 by weight) copolymer (intrinsic viscosity: 0.115 at 30°C in methyl ethyl ketone as a solvent), 0.1 g of 3-methyl-2-benzoylmethylenenaphtho-(1,2-α)thiazole as a sensitizer and 90 g of methyl cellosolve acetate to prepare a light-sensitive liquid. The light-sensitive liquid was coated onto a grained and silicate-treated aluminum plate of a thickness of 0.3 mm and dried at 100°C for 2 minutes to obtain a light-sensitive plate for lithographic printing having a coated weight of 2.52 g/m². A negative film having alphabetic designations was contacted with this light-sensitive plate and exposed to a carbon arc lamp of 3 A at an distance of 70 cm. After the exposure, the development was carried out with weak aqueous alkaline solution containing 1% of sodium silicate and 1% of Monogen Y-100 (sodium lauryl sulfate, trade mark, produced by Daiichi Kogyo Yakuhin K.K.) as a surfactant to obtain a lithographic printing plate rich in reproducibility.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition which comprises (a) 80 to 50% by weight of a divinylurethane compound represented by the following general formula $$\left[ CH_2{=}\overset{R_1}{\overset{|}{C}}-\overset{O}{\overset{\|}{C}}OCH_2\overset{R_2}{\overset{|}{C}}HO-(\overset{O}{\overset{\|}{C}}-A-\overset{O}{\overset{\|}{C}}OCH_2\overset{R_3}{\overset{|}{C}}HO)_n-\overset{O}{\overset{\|}{C}}NH \right]_2 B$$

in which $R_1$, $R_2$ and $R_3$ each represents a hydrogen atom or a methyl group, *n* represents 1, 2 or 3, A represents a divalent residue of a cyclic carboxylic acid anhydride having 4 to 10 carbon atoms, B represents $—R_4—$ or $—R_4NHCOOR_5OOCNHR_4—$, in which $R_4$ represents an alkylene group with 4 to 13 carbon atoms, cycloalkylene group or arylene group and $R_5$ represents an alkylene chain with 2 to 8 carbon atoms or an oxyalkylene chain with 2 to 4 carbon atoms, (b) 20 to 50% by weight of an organic high molecular weight polymer miscibile with said divinylurethane compound and having carboxyl groups on the side chains and an acid number of 30 or more and (c) 0.01 to 10% by weight of a light sensitizer capable of initiating the photopolymerization of an ethylenically unsaturated compound upon exposure to active radiation.

2. The photopolymerizable composition of claim 1, wherein A represents the divalent residue of a cyclic carboxylic acid anhydride selected from the group consisting of phthalic anhydride, tetrahydrophthalic anhydride, hexahydrophthalic anhydride, succinic anhydride, maleic anhydride, 3,6-endomethylene-Δ⁴-tetrahydrophthalic anhydride, 3,6-endooxy-Δ⁴-tetrahydrophthalic anhydride, α-chloro-maleic anhydride, α-phenyl maleic anhydride, and glutaric anhydride; wherein $R_4$ is

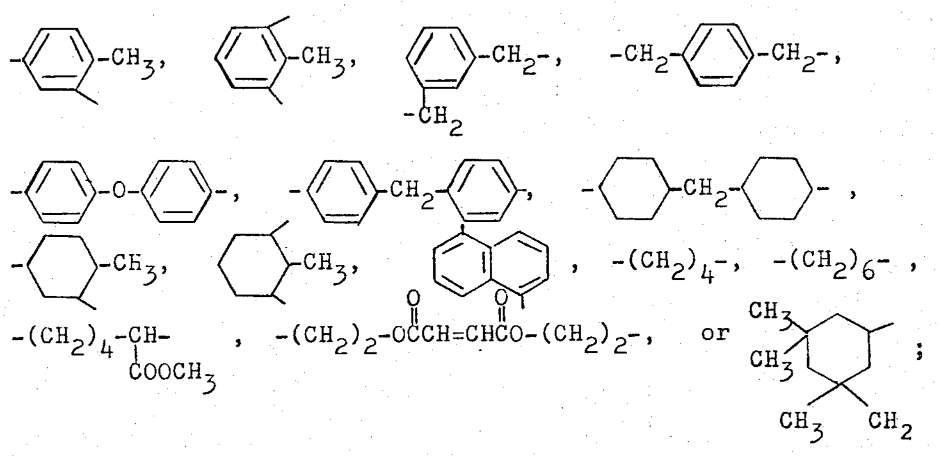

wherein $R_5$ is $—CH_2CH_2—$, $—(CH_2)_4—$, $—(CH_2)_6—$, $—CH_2CH_2—(OCH_2CH_2)_l—$, $$—CH_2\overset{CH_3}{\overset{|}{C}}H—(OCH_2—\overset{CH_3}{\overset{|}{C}}H)_m—,$$

or $—CH_2CH_2CH_2CH_2—(OCH_2CH_2CH_2CH_2)_n—$, wherein 1, *m* and *n* each represent 1 to 10.

3. The photopolymerizable composition of claim 1, wherein said organic high molecular weight polymer is a cellulose derivative having carboxyl groups on the side chains, an acidic polyvinyl alcohol derivative having carboxyl groups on the side chains, an acrylic acid copolymer, a methacrylic acid copolymer, an itaconic acid copolymer, a crotonic acid copolymer, or a maleic anhydride copolymer partially esterified with an alcohol.

4. The photopolymerizable composition of claim 1, wherein said organic high molecular weight polymer has a molecular weight of at least 1000.

5. The photopolymerizable composition of claim 1, wherein said organic high molecular weight polymer is present in an amount of 30 to 40 % by weight, based on the total composition weight.

6. The photopolymerizable composition of claim 3, wherein said organic high molecular weight polymer is selected from the group consisting of cellulose acetate phthalate, hydroxypropylmethyl cellulose phthalate, hydroxypropylmethyl cellulose acetate hexahydrophthalate, methylmethacrylate/methacrylic acid copolymer (90/10 wt%), methylmethacrylate/acrylonitrile/acrylic acid copolymer (75/15/10 wt%), styrene/itaconic acid copolymer (90/10 wt%), vinyl acetate/crotonic acid copolymer (93/7 wt%), and styrene/maleic anhydride copolymer (50/50 mol%) esterified with an alcohol having 1 to 18 carbon atoms.

7. The photopolymerizable composition of claim 1, wherein said sensitizer is at least one member selected from the group consisting of benzoin, benzoin alkyl ethers, anthraquinone derivatives, benzyl, bicarbonyl compounds, carbonyl compounds, 9-phenylacridine and 3-methyl-2-benzoylmethylenenaphtho (1,2-$\alpha$) thiazole.

8. The photopolymerizable composition of claim 1, wherein said sensitizer is at least one member selected from the group consisting of benzoin, benzoin methyl ether, benzoin ethyl ether, 2-ethylanthraquinone, 2-t-butylanthraquinone, benzyl, 4,4'-oxydibenzyl, biacetyl, benzophenone, Michler's ketone, xanthone, 2-chloroxanthone, triacetylbenzene, anthrone, 9-phenylacridine and 3-methyl-2-benzoylmethylenenaphtho (1,2-$\alpha$) thiazole.

9. The photopolymerizable composition of claim 7, wherein said sensitizer is present in an amount of from 0.5 to 2 % by weight.

* * * * *